(12) United States Patent
Beyer et al.

(10) Patent No.: US 7,943,462 B1
(45) Date of Patent: May 17, 2011

(54) TRANSISTOR INCLUDING A HIGH-K METAL GATE ELECTRODE STRUCTURE FORMED PRIOR TO DRAIN/SOURCE REGIONS ON THE BASIS OF A SACRIFICIAL CARBON SPACER

(75) Inventors: Sven Beyer, Dresden (DE); Thilo Scheiper, Dresden (DE); Jan Hoentschel, Dresden (DE); Markus Lenski, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/894,579

(22) Filed: Sep. 30, 2010

(30) Foreign Application Priority Data

Oct. 30, 2009 (DE) .......................... 10 2009 046 261

(51) Int. Cl.
*H01L 21/8238* (2006.01)
*H01L 21/8234* (2006.01)
*H01L 21/336* (2006.01)

(52) U.S. Cl. ........ 438/230; 438/275; 438/303; 438/696; 257/19; 257/E21.038; 257/E29.152

(58) Field of Classification Search .................. 438/230, 438/275, 303, 696; 257/19, E21.038, E29.152
See application file for complete search history.

(56) References Cited

U.S. PATENT DOCUMENTS 7,659,213 B2 * 2/2010 Wei et al. ...................... 438/766

* cited by examiner

*Primary Examiner* — Hsien-ming Lee
(74) *Attorney, Agent, or Firm* — Williams, Morgan & Amerson, P.C.

(57) ABSTRACT

When forming sophisticated high-k metal gate electrode structures in an early manufacturing stage, the dielectric cap layer of the gate electrode structures may be efficiently removed on the basis of a carbon spacer element, which may thus preserve the integrity of the silicon nitride spacer structure. Thereafter, the sacrificial carbon spacer may be removed substantially without affecting other device areas, such as isolation structures, active regions and the like, which may contribute to superior process conditions during the further processing of the semiconductor device.

20 Claims, 5 Drawing Sheets

TRANSISTOR INCLUDING A HIGH-K METAL GATE ELECTRODE STRUCTURE FORMED PRIOR TO DRAIN/SOURCE REGIONS ON THE BASIS OF A SACRIFICIAL CARBON SPACER

BACKGROUND OF THE INVENTION

1. Field of the Invention

Generally, the present disclosure relates to the fabrication of highly sophisticated integrated circuits including transistor elements that comprise a high-k metal gate electrode structure formed in an early process stage.

2. Description of the Related Art

The fabrication of advanced integrated circuits, such as CPUs, storage devices, ASICs (application specific integrated circuits) and the like, requires a great number of circuit elements to be formed on a given chip area according to a specified circuit layout, wherein field effect transistors represent one important type of circuit element that substantially determines performance of the integrated circuits. Currently, a plurality of process technologies are practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a planar transistor architecture, the distance between the source and drain regions, which is also referred to as channel length.

Presently, the vast majority of integrated circuits are formed on the basis of silicon due to its substantially unlimited availability, the well-understood characteristics of silicon and related materials and processes and the experience gathered during the past 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material for gate insulation layers that separate the gate electrode, frequently comprised of polysilicon, from the silicon channel region. In steadily improving device performance of field effect transistors, the length of the channel region has been continuously decreased to improve switching speed and drive current capability. Since the transistor performance is controlled by, among other things, the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling in combination with sophisticated lateral and vertical dopant profiles in the drain and source regions to avoid the so-called short channel behavior during transistor operation. The short channel behavior may lead to an increased leakage current and to a pronounced dependence of the threshold voltage on the channel length. Aggressively scaled planar transistor devices with a relatively low supply voltage and, thus, reduced threshold voltage may suffer from an exponential increase of the leakage current due to the required enhanced capacitive coupling of the gate electrode to the channel region. Thus, the thickness of the silicon dioxide layer has to be correspondingly reduced to provide the required capacitance between the gate and the channel region. For example, a channel length of approximately 0.08 µm may require a gate dielectric made of silicon dioxide as thin as approximately 1.2 nm. Although usage of high speed transistor elements having an extremely short channel may typically be restricted to high speed applications, whereas transistor elements with a longer channel may be used for less critical applications, such as storage transistor elements, the relatively high leakage current caused by the direct tunneling of charge carriers through an ultra-thin silicon dioxide gate insulation layer may reach values for an oxide thickness in the range of 1-2 nm that may no longer be compatible with requirements for many types of circuits.

For this reason, new strategies have been developed in overcoming the limitations imposed by high leakage currents of extremely thin silicon oxide-based gate insulation layers. One very promising approach is the replacement of the conventional dielectric materials, at least partially, by dielectric materials having a dielectric constant that is significantly greater than the dielectric constant of silicon dioxide-based materials. For example, dielectric materials, also referred to as high-k dielectric materials, with a dielectric constant of 10.0 and significantly higher may be used, for instance in the form of hafnium oxide, zirconium oxide and the like. In addition to providing a high-k dielectric material in the gate insulation layers, appropriate metal-containing materials also may have to be incorporated since the required work function values for P-channel transistors and N-channel transistors may not be obtained on the basis of standard polysilicon gate materials. To this end, appropriate metal-containing materials may be provided so as to cover the sensitive high-k dielectric materials and act as a source for incorporating an appropriate metal species, such as lanthanum, aluminum and the like, in order to appropriately adjust the work function for N-channel transistors and P-channel transistors, respectively. Furthermore, due to the presence of a metal-containing conductive material, the generation of a depletion zone, as may typically occur in polysilicon-based electrode materials, may be substantially avoided. The process of fabricating a sophisticated gate electrode structure on the basis of a high-k dielectric material may require a moderately complex process sequence due to, for instance, the adjustment of an appropriate work function for the transistors of different conductivity type and the fact that high-k dielectric materials may typically be very sensitive when exposed to certain process conditions, such as high temperatures in the presence of oxygen and the like. Therefore, different approaches have been developed, such as providing the high-k dielectric material at an early manufacturing stage and processing the semiconductor devices with a high degree of compatibility with standard process techniques, wherein the typical electrode material polysilicon may be replaced in a very advanced manufacturing stage with appropriate metals for adjusting the work function of the different transistors and for providing a highly conductive electrode metal. While this approach may provide superior uniformity of the work function and thus of the threshold voltage of the transistors, since the actual adjustment of the work function may be accomplished after any high temperature processes, a complex process sequence for providing the different work function metals in combination with the electrode metal may be required. In other very promising approaches, the sophisticated gate electrode structures may be formed in an early manufacturing stage, while the further processing may be based on the plurality of well-established process strategies. In this case, the high-k dielectric material and any metal species for adjusting the work function may be provided prior to or upon patterning the gate electrode stack, which may comprise well-established materials, such as silicon and silicon/germanium, thereby enabling the further processing on the basis of well-established process techniques. On the other hand, the gate electrode stack and, in particular, the sensitive high-k dielectric materials in combination with any metal-containing cap layers may remain reliably confined by appropriate materials throughout the entire processing of the semiconductor device.

Further concepts for enhancing performance of transistors have been developed by providing a plurality of strain-inducing mechanisms in order to increase the charge carrier mobility in the channel regions of the various transistors. It is well known that charge carrier mobility in silicon may be efficiently increased by applying certain strain components, such as tensile and compressive strain for N-channel transistors and P-channel transistors, respectively, so that superior transistor performance may be obtained for an otherwise identical transistor configuration compared to non-strained silicon materials. For instance, efficient strain-inducing mechanisms may be implemented by incorporating a strained semiconductor material in the drain and source regions of transistors, for instance in the form of a silicon/germanium alloy, a silicon/carbon alloy and the like, wherein the lattice mismatch between the semiconductor alloy and the silicon base material may result in a tensile or compressive state, which in turn may induce a desired type of strain in the channel region of the transistor. Other efficient strain-inducing mechanisms are well established in which a highly stressed dielectric material may be positioned in close proximity to the transistor, thereby also inducing a certain type of strain in the channel region.

Although the approach of providing a sophisticated high-k metal gate electrode structure in an early manufacturing stage, possibly in combination with additional strain-inducing mechanisms, may have the potential of providing extremely powerful semiconductor devices, such as CPUs, storage devices, systems on a chip (SOC) and the like, conventional approaches may still suffer from process non-uniformities, as will be described with reference to FIGS. 1a-1f.

FIG. 1a schematically illustrates a cross-sectional view of a semiconductor device 100 comprising a substrate 101, such as a silicon substrate, in combination with a semiconductor layer 102, such as a silicon layer or a semiconductor material comprising a significant amount of silicon. In the manufacturing stage shown, the semiconductor device 100 further comprises transistors 150A, 150B in an early manufacturing stage which may be formed in and above an active region 102A and 102B, respectively. An active region is to be understood as a semiconductor region in the layer 102 in which PN junctions for one or more transistors are to be formed. An isolation structure 102C, such as a trench isolation, is provided in the semiconductor layer 102 and may laterally delineate active regions, such as the regions 102A, 102B. Furthermore, a plurality of gate electrode structures 160A, 160B and 160C may be formed above the semiconductor layer 102. In FIG. 1a, the gate electrode structures 160A, 160B are illustrated at a cross-section in which the gate electrode structures 160A, 160B are formed on the active regions 102A and 102B, respectively, wherein it should be appreciated that these gate electrode structures may extend beyond the corresponding active region, if required, and may thus be formed above a corresponding isolation region. For example, the gate electrode structure 160C may represent a corresponding portion of a gate electrode structure or may represent a conductive line or any other circuit element, such as a resistive structure and the like, which may have a similar configuration as the gate electrode structures 160A, 160B. As previously discussed, the gate electrode structures may comprise a gate insulation layer 161 formed on the active region 102A and 102B, respectively, and may comprise a high-k dielectric material, such as hafnium oxide-based materials and the like. It should be appreciated that, frequently, the gate insulation layer 161 may additionally comprise a conventional dielectric material, such as a silicon oxide-based material, however, with a significantly reduced thickness of approximately 0.8 nm and less. Consequently, in total, the gate insulation layer 161 may have a thickness of 1.5 nm and more, while still providing an oxide equivalent thickness that may be 1 nm and less, while leakage currents may be significantly less compared to a conventional extremely thin silicon oxide-based material. Moreover, a metal-containing material may be formed on the gate insulation layer 161 and may have a different composition for transistors of different conductivity type. For example, a conductive cap layer 162A may be provided in the gate electrode structure 160A including a work function adjusting species for the transistor 150A, while a conductive cap layer 162B including a work function species for the transistor 150B may be applied in the gate electrode structure 160B. Typically, the gate electrode structure 160C may have one of the layers 162A, 162B. Moreover, an electrode material 163, such as silicon, silicon/germanium and the like, may be formed above the conductive cap layers 162A, 162B, respectively, followed by a dielectric cap layer 164, which is typically comprised of silicon nitride.

Furthermore, a sidewall spacer structure 165, which may comprise a liner material 165A in combination with a spacer element 165B may be provided so as to protect the sidewalls of the electrode material 163 and in particular of the sensitive materials 162A, 161. The liner 165A and the spacer element 165B may typically be comprised of silicon nitride. As illustrated, above the active region 102b and the gate electrode structure 160B, the materials 165A, 165B may be in the form of non-patterned layers in order to provide a growth mask for forming a strain-inducing semiconductor material 151 in the active region 102A so as to increase the charge carrier mobility in a channel region 152 of the transistor 150A. Moreover, the active region 102A may comprise a semiconductor alloy 152A in the channel region, for instance a silicon/germanium alloy, in order to adjust the band gap offset of the channel region, thereby obtaining a desired threshold voltage in combination with the materials 161 and 162A for the transistor 150A.

As previously discussed, the semiconductor alloy 151, for instance provided in the form of a silicon/germanium alloy, may have a strained state and may thus induce a desired strain in the channel region 152. For instance, silicon/germanium may represent a very efficient strain-inducing source for P-channel transistors.

The semiconductor device 100 as illustrated in FIG. 1a may be formed on the basis of the following conventional process strategies. After forming the isolation region 102C and thus delineating the active regions 102A, 102B, the material layer 152A may be formed selectively in the active region 102A. Next, appropriate materials for the gate insulation layer 161 and one of the layers 162A and 162B may be formed by any appropriate deposition technique. Thereafter, the conductive cap material may be appropriately patterned and the other one of the layers 162A, 162B is deposited, possibly followed by any heat treatments in order to appropriately diffuse a work function adjusting species towards the gate insulation layer 161. Prior to or after the corresponding adjustment of the work function, the electrode material 163, for instance in the form of silicon, may be deposited on the basis of well-established deposition techniques, followed by the deposition of the dielectric cap layer 164. Furthermore, additional materials, such as hard mask materials and the like, may be provided if required and thereafter a sophisticated lithography process and an anisotropic etch sequence may be performed in order to obtain the gate electrode structures 160A, 160B, 160C. During the patterning process, the dielectric cap layer 164 may thus provide superior efficiency of the patterning process and may also be used during the subsequent processing so as to encapsulate the electrode material 163 and the materials 162A, 161. As previously discussed, in sophisticated applications, a length of the gate electrode structures 160A, 160B, 160C, i.e., in FIG. 1a, a horizontal extension of the electrode material 163, may be 50 nm and less. Next, the materials 165A, 165B may be formed, for instance, by thermally activated chemical vapor deposition (CVD) techniques, plasma enhanced CVD techniques and the like, in order to form, in particular, the liner material 165A as a very dense silicon nitride material so as to reliably confine the sidewalls of the gate electrode structures. Thereafter, an etch mask may be provided to cover the transistor 150B in order to form the spacer elements 165B and possibly etch into the active region 102A in order to form corresponding cavities therein. During the corresponding etch process, the spacer structure 165 may substantially determine a lateral offset of the corresponding cavities with respect to the channel region 152. Next, a selective epitaxial growth process is performed in order to grow the strain-inducing semiconductor material 151. During a selective epitaxial growth process, process parameters are adjusted such that a significant material deposition on dielectric surface areas, such as the cap layers 164, the material 165B and the isolation region 102C, is substantially suppressed.

FIG. 1b schematically illustrates the semiconductor device 100 in a manufacturing stage in which an etch mask 103 covers the active region 102A and possibly the isolation region 102C, while exposing the gate electrode structure 160B and the active region 102B. Moreover, an etch process 104 is applied so as to obtain the spacer structure 165 on sidewalls of the gate electrode structure 160B. For this purpose, well-established plasma assisted etch recipes are applied. It should be appreciated that, during the etch process 104, a certain amount of material erosion in the active region 102B or material modification may occur, depending on the etch chemistry used. For example, plasma assisted etch recipes for removing silicon nitride may exhibit a self-limiting behavior when etching a silicon material, which may be caused by the generation of silicon dioxide, which may then act as an efficient etch stop material.

Thereafter, the etch mask 103 may be removed and thus the gate electrode structures 160A, 160B, 160C may have a substantially similar configuration, i.e., may comprise the sidewall spacer structure 165, which may be used as an offset spacer structure for controlling a subsequent implantation sequence for introducing dopant species so as to form drain and source extension regions and halo regions, i.e., counter-doped regions, in order to obtain the required complex dopant profile for adjusting the overall transistor characteristics. During the further processing, the dielectric cap layers 164 may also have to be removed, which may, however, have a significant influence on the resulting device topography and thus on the resulting transistor characteristics. For instance, upon removing the dielectric cap material 164, etch chemistries, such as hot phosphoric acid, are typically applied which, however, may exhibit a significant lateral etch rate, thereby causing a significant degree of material erosion of the spacer structure 165. For this reason, the spacer structure 165 is protected by providing a sacrificial oxide spacer element having a high etch resistivity with respect to hot phosphoric acid.

FIG. 1c schematically illustrates the semiconductor device 100 with an oxide spacer layer 166, which may be etched during an etch process 105 in order to form sacrificial oxide spacers 166S on the sidewall spacer structure 165. Consequently, during the etch process 105, a certain degree of material erosion 105R may occur in the isolation structure 102C due to a certain required overetch time during which oxide material of the isolation structure 102C is removed.

FIG. 1d schematically illustrates the device 100 when exposed to a further etch process 106 for removing the dielectric cap material 164 (FIG. 1c) on the basis of hot phosphoric acid. As discussed above, during the etch process 106, the silicon nitride spacer structure 165 is protected by the sacrificial spacer elements 166S.

FIG. 1e schematically illustrates the semiconductor device 100 in a further advanced manufacturing stage. As illustrated, the sacrificial sidewall spacers 166s (FIG. 1d) are removed, which may be accomplished on the basis of diluted hydrofluoric acid (HF), which, however, may also remove a further portion of the isolation structure 102C, thereby increasing the recess 105R. Consequently, after the removal of the dielectric cap layer 164

(FIG. 1c), a pronounced surface topography in the form of the recess 105R may be created, which may have a significant influence on the further processing.

FIG. 1f schematically illustrates the semiconductor device 100 in a further advanced manufacturing stage. As illustrated, a further sidewall spacer structure 155 is formed adjacent to the spacer structure 165 (FIG. 1e) and is typically comprised of silicon nitride, possibly in combination with a silicon dioxide etch stop liner (not shown). Furthermore, drain and source regions 153 are formed in the active regions 102A, 102B corresponding to the conductivity type of the transistors 150A, 150B. Furthermore, metal silicide regions 154 are formed in the drain and source regions 153 and metal silicide regions 167 are provided in the gate electrode structures 160A, 160B, 160C. Additionally, a dielectric layer 120, which may have a high internal stress level, is formed above the active regions 102A, 102B, the isolation region 102C and above the gate electrode structures 160A, 160B, 160C. As previously explained, a highly stressed dielectric material provided in the vicinity of a channel region of a transistor may represent an efficient strain-inducing mechanism, wherein the resulting amount of transistor performance enhancement may strongly depend on the internal stress level of the layer 120 and the amount of highly stressed material positioned in close proximity to the channel region 152, which in turn may thus depend on the thickness of the layer 120. Consequently, in view of enhancing transistor performance, an increased layer thickness is highly desirable for the layer 120, which, however, may be restricted by the pronounced surface topography, in particular in the isolation region 102C. That is, in device areas comprising closely spaced gate electrode structures extending along an isolation region, such as the region 102C, the pronounced recessing caused by the previous processing may additionally increase the resulting aspect ratio that is "seen" during the deposition of the material 120. Consequently, in view of the pronounced recessing of the isolation structure 102C, a reduced thickness of the layer 120 may have to be provided in order to avoid deposition-related irregularities, which may otherwise result in significant yield losses during the further processing, for instance when forming contact elements and the like.

The semiconductor device 100 as illustrated in FIG. 1f may be formed in accordance with the following process techniques. The spacer structure 155 is typically formed by depositing a silicon nitride material, possibly in combination with a silicon dioxide etch stop liner, and patterning the silicon nitride layer so as to obtain a spacer element, as shown. Prior to and after forming the sidewall spacer structure 155, implantation processes are performed in order to introduce dopant species, thereby forming the drain and source regions 153. After any anneal processes in which the final dopant profile may be established, further cleaning processes are performed in order to prepare the exposed semiconductor surface areas for forming the metal silicide regions 154, 167. Typically, during any such cleaning processes, a further recessing in the isolation region 102C may be caused, thereby further contributing to the very pronounced surface topography. Thereafter, a silicidation process may be performed wherein the spacer structure 155 may substantially determine the lateral offset of the metal silicide regions 154 with respect to the channel region 152. Next, the dielectric material 120 is deposited, wherein, depending on the process requirements, a complex deposition and patterning sequence may also have to be applied when dielectric materials of different internal stress levels are to be provided above the transistor 150A and the transistor 150B. During the corresponding deposition process or processes, the pronounced surface topography has to be taken into consideration, as discussed above, thereby possibly reducing the efficiency of the strain-inducing effect of the dielectric material 120.

Consequently, although the conventional approach may provide high performance transistors on the basis of the high-k metal gate electrode structures 160A, 160B, 160C, the pronounced surface topography in the isolation region 102C mainly caused by the removal of the dielectric cap layer 164, results in reduced device performance and increased yield loss.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques in which a sophisticated high-k metal gate electrode structure may be provided in an early manufacturing stage. Furthermore, a sidewall spacer structure required for reliably confining sensitive materials of the gate electrode structure may be preserved throughout the entire process flow and, in particular, the removal of a dielectric cap material of the gate electrode structure, which may be accomplished by providing a sacrificial spacer structure. The sacrificial spacer structure, or at least a significant portion thereof, may be removed substantially without affecting the resulting surface topography, thereby enabling the further processing on the basis of superior process conditions, which in turn may translate into enhanced performance and reliability of the resulting semiconductor device. In some illustrative aspects, the sacrificial spacer structure may comprise a carbon spacer element, which may provide high etch resistivity with respect to a plurality of plasma-assisted etch processes, for instance as used for removing silicon nitride materials, while, on the other hand, a carbon material may be efficiently removed, for instance, on the basis of an oxygen plasma, substantially without affecting other device areas, such as silicon oxide based isolation structures and the like.

One illustrative method disclosed herein comprises forming a gate electrode structure of a transistor above a semiconductor region of a semiconductor device. The gate electrode structure comprises a gate insulation layer comprising a high-k gate dielectric material, a metal-containing cap material formed on the gate insulation layer, an electrode material formed above the cap material, a dielectric cap layer formed above the electrode material and a sidewall spacer structure. The method additionally comprises forming a sacrificial carbon spacer on the sidewall spacer structure and removing the dielectric cap layer by using the sacrificial carbon spacer as an etch stop material for protecting the sidewall spacer structure. Moreover, the sacrificial carbon spacer is removed.

One further illustrative method disclosed herein relates to forming a transistor of a semiconductor device. The method comprises forming a strain-inducing semiconductor alloy in an active region in the presence of a gate electrode structure, which comprises a high-k dielectric material, an electrode material, a dielectric cap layer and a sidewall spacer structure. The method further comprises forming a sacrificial spacer structure on the sidewall spacer structure and removing the dielectric cap layer selectively to the sacrificial spacer structure by performing a plasma-assisted etch process. The method further comprises removing at least a portion of the sacrificial spacer structure and forming drain and source regions in the active region.

A still further illustrative method disclosed herein relates to forming a semiconductor device. The method comprises forming a first gate electrode structure above a first active region and a second gate electrode structure above a second active region. The method further comprises forming a first spacer structure selectively on sidewalls of the first gate electrode structure from a spacer layer, wherein a remaining portion of the spacer layer covers the second gate electrode structure and the second active region. The method further comprises forming a strain-inducing semiconductor material in the first active region by using the first spacer structure, the remaining portion of the spacer layer and a dielectric cap layer of the first and second gate electrode structures as a mask. Additionally, the method comprises forming a second spacer structure on sidewalls of the second gate electrode structure from the remaining portion of the spacer layer and forming a protective spacer structure on the first and second spacer structures, wherein the protective spacer structure comprises a carbon spacer element. The method additionally comprises removing the dielectric cap layer from the first and second gate electrode structures by using the protective spacer structure as an etch mask. Furthermore, drain and source regions are formed in the first and second active regions.

BRIEF DESCRIPTION OF THE DRAWINGS

The disclosure may be understood by reference to the following description taken in conjunction with the accompanying drawings, in which like reference numerals identify like elements, and in which.

Figure 1A:
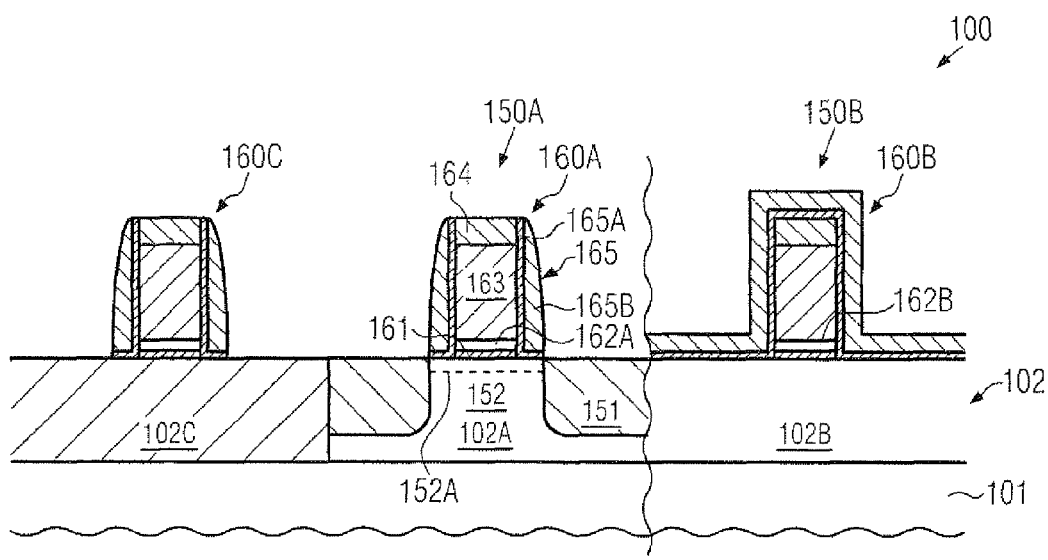
FIGS. 1a-1f schematically illustrate cross-sectional views of a semiconductor device during various manufacturing stages in providing a sophisticated high-k metal gate electrode structure in combination with a strain-inducing material on the basis of a conventional strategy, in which integrity of the gate electrode structure may be maintained on the basis of a sidewall spacer structure in combination with a sacrificial oxide spacer.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides manufacturing techniques in which the superior characteristics of a carbon material may be taken advantage of in protecting a sophisticated sidewall spacer structure during a critical manufacturing phase in which a dielectric cap material is to be removed from a sophisticated gate electrode structure. As is well known, amorphous carbon material may be increasingly used as an efficient hard mask material in complex patterning processes during semiconductor fabrication, since amorphous carbon may be deposited on the basis of plasma enhanced CVD techniques within a wide range of process temperatures and with moderately high deposition rates. Furthermore, the amorphous carbon material may be efficiently removed on the basis of oxygen plasma recipes, substantially without affecting other material systems, such as semiconductor materials, silicon dioxide, silicon nitride and the like. Consequently, amorphous carbon material may be used as a very efficient "sacrificial" material due to its high etch resistivity in plasma-based reactive etch processes and due to the efficient removal behavior during oxygen-based plasmas. According to the principles disclosed herein, the complex process sequence, as previously described with reference to the semiconductor device 100 in FIGS. 1a-1f, may be modified in order to reduce the pronounced surface topography, resulting from the removal of a dielectric cap layer of sophisticated gate electrode structures, by implementing a sacrificial spacer structure, which may include at least one carbon spacer element, which may be removed substantially without affecting sensitive device areas, such as active regions and, in particular, isolation regions. In order to efficiently use a carbon-based sacrificial spacer structure, the etch process for removing the dielectric cap material may be performed on the basis of a plasma-assisted etch process, wherein, as discussed above, a lateral etch rate may not negatively affect the gate electrode structure and a corresponding spacer structure formed thereon due to the presence of the carbon-based sacrificial spacer structure, which has a high etch selectivity with respect to the plasma etch ambient. Consequently, the integrity of the sophisticated gate electrode structures may be preserved throughout the entire process flow without contributing to an undesired pronounced surface topography.

With reference to FIGS. 2a-2d, further illustrative embodiments will now be described in more detail, wherein reference is also made to FIGS. 1a-1f.

Figure 2A:
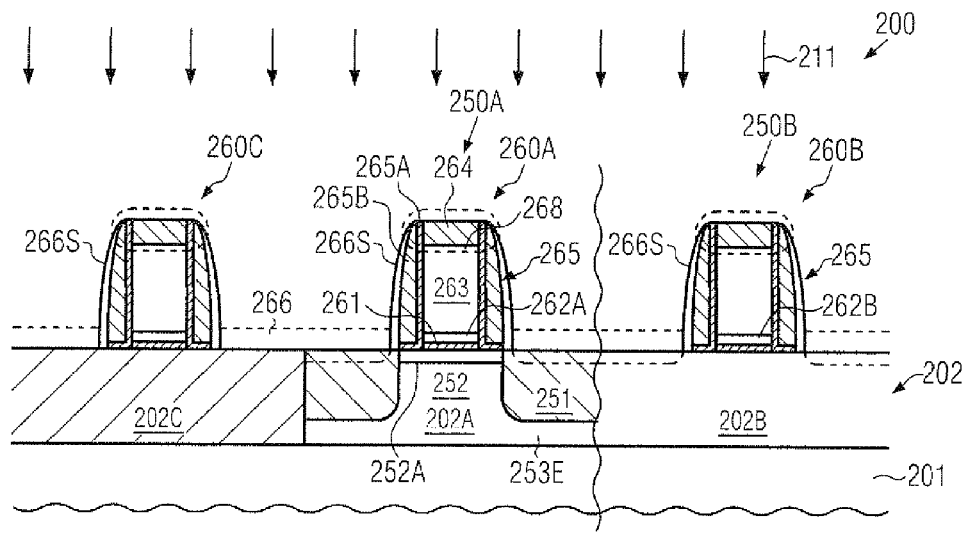
FIGS. 2a-2d schematically illustrate cross-sectional views of a semiconductor device during various manufacturing stages in which a sidewall spacer structure of a sophisticated gate electrode structure may be protected during the removal of a dielectric cap material on the basis of a sacrificial spacer element, which may comprise a carbon spacer, in accordance with illustrative embodiments.

FIG. 2a schematically illustrates a cross-sectional view of a semiconductor device 200 comprising a substrate 201, in and above which may be formed a semiconductor layer 202, such as a silicon layer, a silicon/germanium layer and the like. Moreover, the semiconductor layer 202 may comprise active regions 202A, 202B and an isolation region 202C, which may laterally delineate the active region 202A and/or the active region 202B. A transistor 250A may be formed in and above the active region 202A and may comprise, in the manufacturing stage shown, a gate electrode structure 260A. Similarly, a transistor 250B may be formed in and above the active region 202B and may comprise a gate electrode structure 260B. As is also previously discussed with reference to the semiconductor device 100, the gate electrode structures 260A, 260B may also extend above isolation regions, such as the region 202C, for instance for providing contact areas and/or for connecting to other active regions of other transistor elements. For instance, a gate electrode structure 260C may thus be formed above the isolation structure 202C and may extend to other active regions (not shown) that are located laterally adjacent to the structure 202C in a direction perpendicular to the drawing plane of FIG. 2a. In the example shown, the gate electrode structures 260C, 260A may have substantially the same configuration, for instance representing the gate electrode structures of P-channel transistors, while the gate electrode structure 260B may represent an N-channel transistor. It should be appreciated, however, that any other configuration may be contemplated by the present disclosure. Thus, the gate electrode structures 260C, 260A may comprise a gate dialectic material 261 in combination with a conductive cap material 262A, which may also include an appropriate metal species for adjusting the work function of the gate electrode structures 260C, 260A so as to comply with the requirements of the transistor 250A. Moreover, an electrode material 263, such as a silicon material and the like, may be provided above the layers 262A. Moreover, a dielectric cap layer 264, such as a silicon nitride material, may be formed above the electrode material 263. As indicated, a thin oxide layer 268 may be formed between the material 263 and the dielectric cap layer 264, if required. On the other hand, the gate electrode structure 260B may comprise a gate dialectic material 261 with a conductive cap layer 262B, which may be appropriately configured so as to obtain the desired work function for the gate electrode structure 260B. On the other hand, materials 263, 268 and 264 may also be provided in the gate electrode structure 260B. Additionally, the gate electrode structures 260A, 260B, 260C may comprise a sidewall spacer structure 265 in order to confine the sensitive materials, in particular the materials 261 and 262A, 262B, as is also previously discussed with reference to the semiconductor device 100. As illustrated, the spacer structure 265 may comprise a liner material 265A in combination with a spacer element 265B, while, in other cases, a sidewall spacer element may be provided. It should be appreciated that, with respect to the components described so far, the same criteria may apply as previously described with reference to the device 100 when referring to these components.

Moreover, in the manufacturing stage shown, the transistor 250A may comprise a strain-inducing semiconductor alloy 251, such as a silicon/germanium alloy and the like, in order to provide a desired strain component in a channel region 252. Furthermore, the channel region 252 may comprise a threshold adjusting semiconductor alloy 252A, if required, for instance in the form of a silicon/germanium material. In some illustrative embodiments, drain and source extension regions 253E may be provided in the active regions 202A, 202B, while in other illustrative embodiments, the regions 253E may be formed in a later manufacturing stage. It should be appreciated that, additionally, any counter-doped regions (not shown), typically referred to as "halo regions," may be provided together with the extension regions 253E in order to establish the desired complex dopant profile so as to adjust a threshold voltage of the transistors 250A, 250B in combination with the characteristics of the gate electrode structures 260A, 260B.

Moreover, in the manufacturing stage shown, a sacrificial spacer structure 266S may be formed on the spacer structures 265 and may comprise, in one illustrative embodiment, a carbon-based spacer element. In the embodiment shown, the spacer structure 266S may be substantially provided in the form of a single carbon spacer element, while, in other cases, if required, additional material layers (not shown), such as thin oxide liners, nitride liners and the like, may be provided in addition to a carbon-based spacer element, if desired.

The semiconductor device 200 may be formed on the basis of the following processes. The active regions 202A, 202B and the isolation structure 202C may be formed on the basis of any appropriate manufacturing technique, for instance as is also previously described with reference to the semiconductor device 100. Similarly, at any appropriate manufacturing stage, the threshold adjusting material 252A may be selectively formed in the active region 202A, which may be accomplished by epitaxial growth techniques and the like. Thereafter, the gate electrode structures 260A, 260B, 260C including the dielectric cap layer 264 and the spacer structure 265 may be formed in accordance with any appropriate manufacturing technique, as is also described with reference to the semiconductor device 100. Hence, work function adjusting species in the layers 262A, 262B may be provided on the basis of appropriate deposition and patterning regimes in combination with appropriate process techniques for providing the dielectric material 261, which may include a high-k dielectric material. After the patterning of the materials 263 and 264, the spacer structure 265 may be formed by depositing a spacer layer, as previously described, and selectively patterning the spacer layer to obtain the spacer structure 265, for instance, selectively on sidewalls of the gate electrode structures 260A, 260C, while a remaining portion of the corresponding spacer layer may still cover the transistor 250B and the active region 202B, as is previously described with reference to FIG. 1a.

Figure 1B:
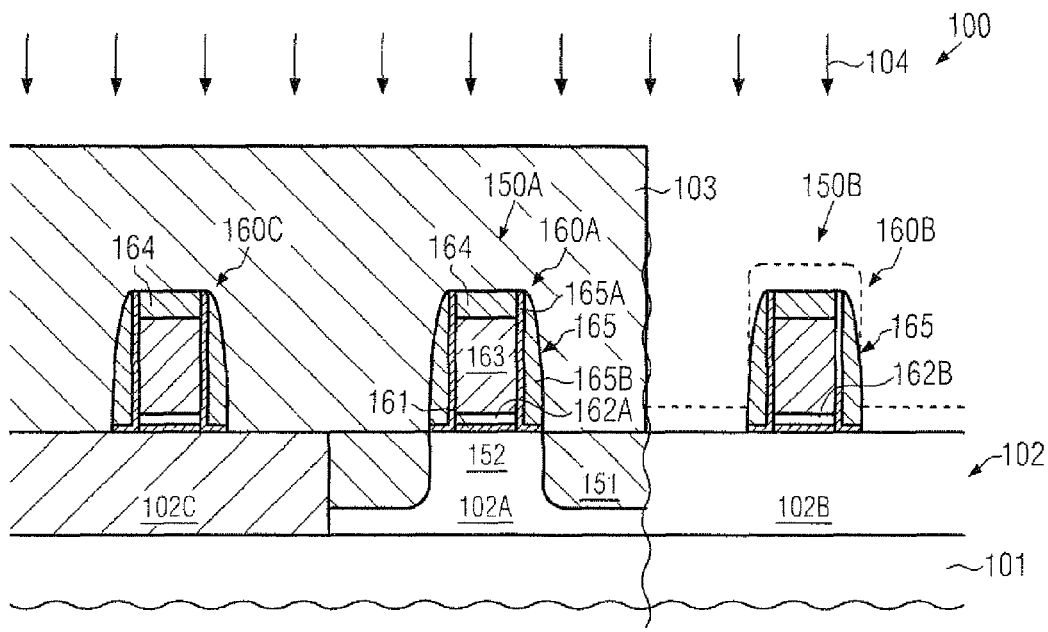
Figure 1C:
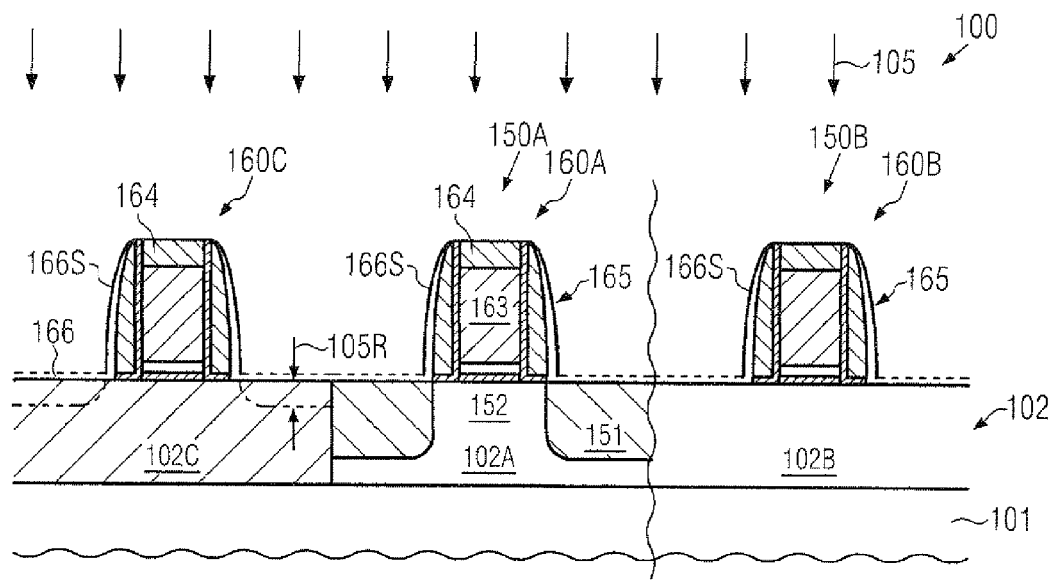
Figure 1D:
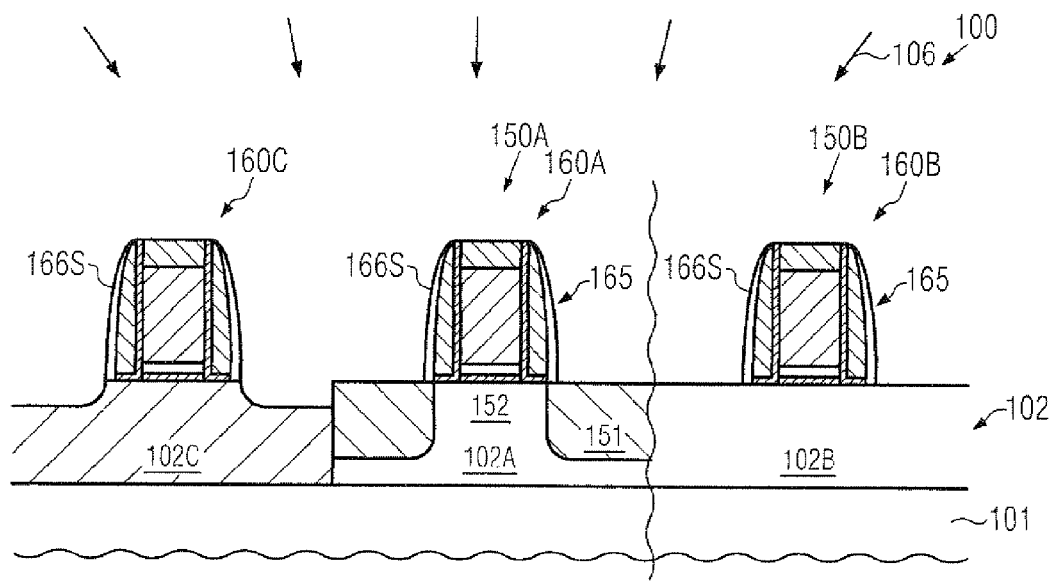
Figure 1E:
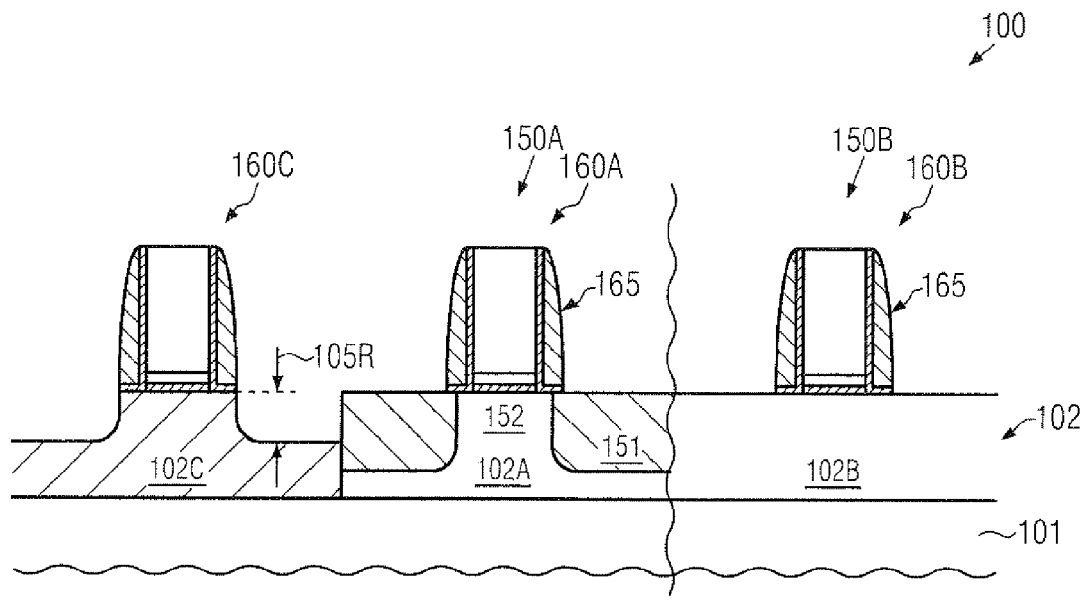
Figure 1F:
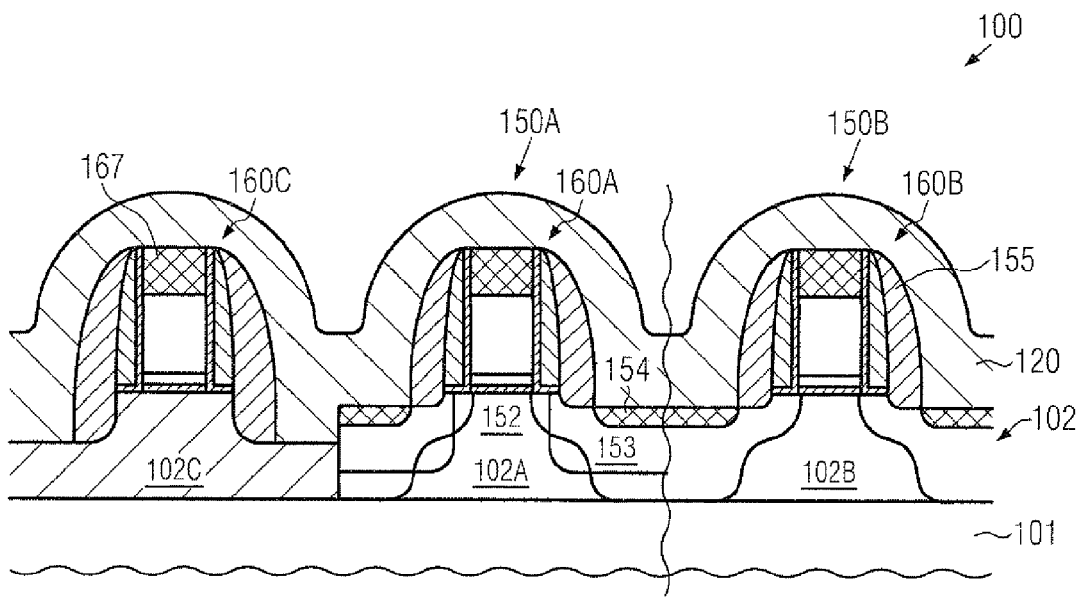

Thereafter, the strain-inducing semiconductor material 251 may be formed, as previously described, followed by the patterning of the spacer layer covering the active region 202B and the gate electrode structure 260B in order to obtain the sidewall spacer structure 265 for the gate electrode structure 260B, as is also previously described with reference to FIG. 1b. In some illustrative embodiments, the drain and source extension regions 253E may be formed on the basis of an appropriate implantation sequence, which may include an appropriate masking regime for alternatively covering the transistors 250A, 250B and introducing the dopant species into the non-covered transistor element. Furthermore, corresponding counter-doped regions may be formed, for instance on the basis of a tilted implantation step, in order to obtain the desired dopant profile in the active regions 202A, 202B in the vicinity of the channel region 252. It should be appreciated that, due to the presence of the cap layer 264, an increased implantation energy may be used for forming the halo regions or counter-doped regions, thereby obtaining a superior distribution of the counter-doping species, while the cap layer 264 may suppress undue penetration of lower portions of the electrode material 263.

In other illustrative embodiments, the extension regions 253E and the halo regions may be formed in a later manufacturing stage. Next, the spacer layer 266 may be formed so as to comprise a carbon layer, possibly in combination with additional liner materials, if required. As discussed above, carbon material may readily be established on the basis of plasma-enhanced CVD techniques using any type of hydrocarbon gas as a precursor material. Furthermore, on the basis of additional gases, such as nitrogen, hydrogen, helium, argon and the like, specific characteristics, such as density and the like, of the carbon material may be adjusted. For example, the spacer layer 266 may be provided with a thickness of approximately 10-40 nm, while other thickness values may also be used, if considered appropriate. Thereafter, an etch process 211 may be performed to form the sacrificial spacer structure 266S from the spacer layer 266, which may be accomplished on the basis of plasma-assisted etch recipes using an oxygen plasma, wherein a certain lateral etch rate may be taken into consideration by appropriately selecting the initial thickness of the spacer layer 266. As previously explained, in particular by applying an oxygen plasma, a material removal in the active regions 202A, 202B and in particular in the isolation region 202C may be substantially avoided. Thus, the sacrificial spacer structure 266S may be provided without deteriorating the surface topography in the isolation region 202C.

Figure 2B:
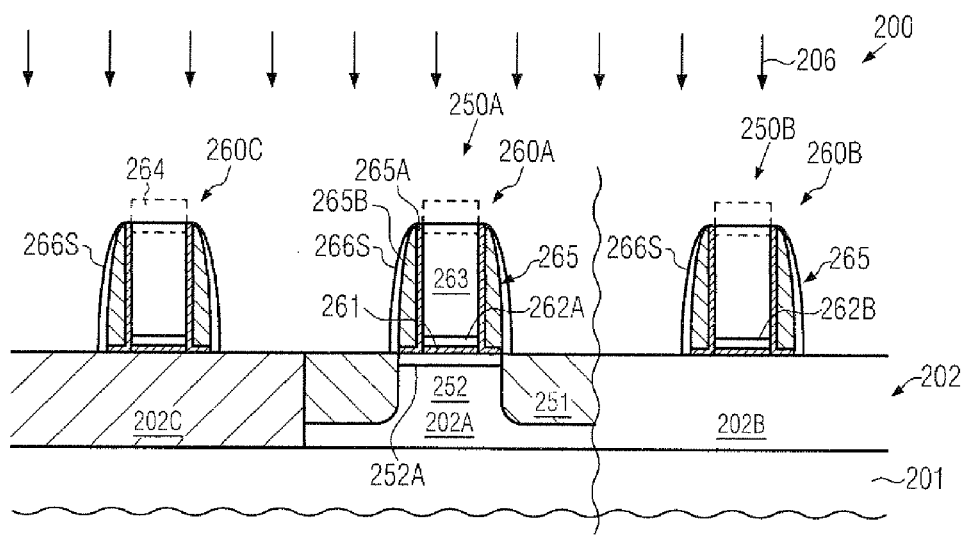

FIG. 2b schematically illustrates the semiconductor device 200 in a further advanced manufacturing stage in which the device 200 is exposed to an etch process 206 in order to remove the dielectric cap layers 264 from the gate electrode structures 260A 260B, 260C. In one illustrative embodiment, the etch process 206 may be performed as a plasma-assisted etch process by using well-established etch chemistries, in which silicon nitride material may be removed selectively with respect to oxide and also selectively with respect to silicon material. Typically, a plasma-assisted silicon nitride etch process may have a certain lateral etch rate, which, however, may not substantially affect the sidewall spacer structure 265 due to the presence of the sacrificial spacer 266S comprising a carbon material, which has a significantly reduced etch rate when exposed to the etch ambient 206. Thus, during the process 206, any undue material erosion in the isolation structure 202C may be substantially avoided. On the other hand, in the active regions 202A, 202B, a substantially self-limiting etch behavior may be accomplished, wherein the etch chemistry 206 may result in the formation of a thin silicon oxide material (not shown), which may thus suppress a further material erosion during the process 206.

Figure 2C:
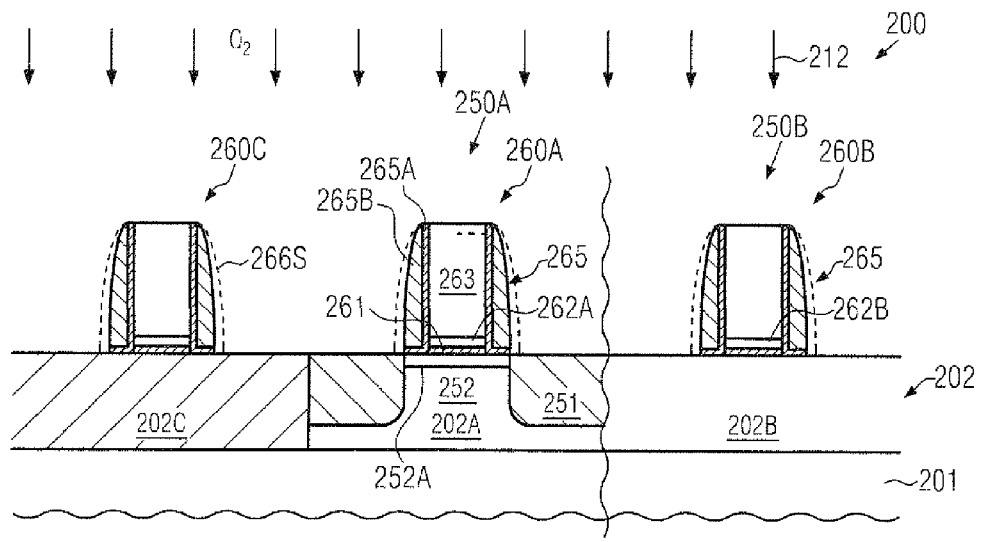

FIG. 2c schematically illustrates the semiconductor device 200 in a further advanced manufacturing stage in which the sacrificial spacer structure 266S or at least a carbon spacer element may be removed during a process 212, which may be performed on the basis of an oxygen plasma. Consequently, during the process 212, at least the carbon material of the spacer structure 266S may be efficiently removed, substantially without affecting other exposed device areas, such as the isolation structure 202C and the active regions 202A, 202B and the corresponding gate electrode structures 260A, 260B, 260C. Consequently, similarly to the process for forming the spacer structure 266S, the process 212 for removing the carbon material may not substantially affect the isolation structure 202C, thereby preserving a desired substantially planar surface topography. After the removal of the sacrificial spacer structure 266S, the processing may be continued, in some illustrative embodiments, by forming the drain and source extension regions (not shown in FIG. 2c), wherein the corresponding implantation energies, in particular the energy of the implantation step for incorporating the counter-doping species, may be adapted to the resulting reduced height of the gate electrode structures 260A, 260B, 260C after the removal of the dielectric cap layer 264 (FIG. 2b).

Figure 2D:
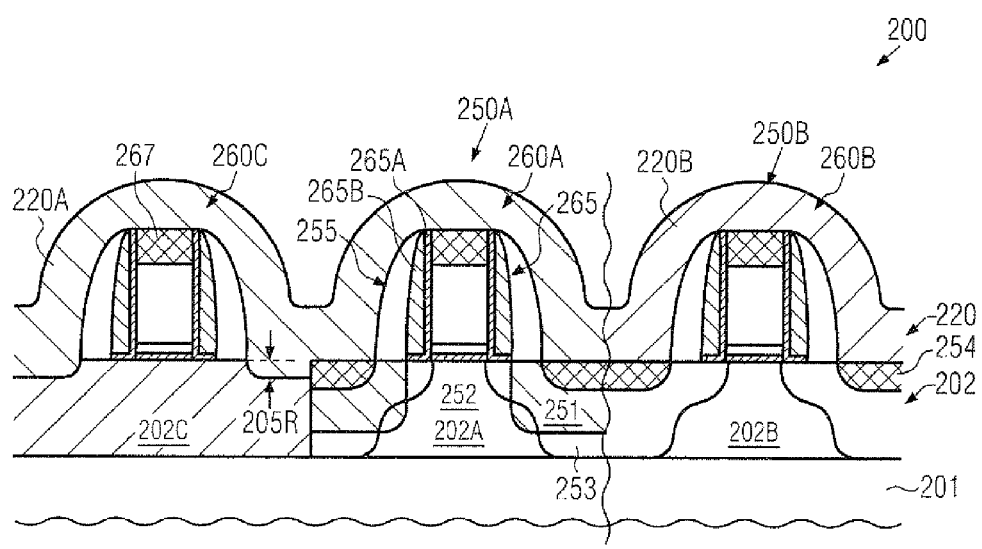

FIG. 2d schematically illustrates the semiconductor device 200 in a further advanced manufacturing stage. As illustrated, the transistors 250A, 250B may comprise drain and source regions 253 including the extension regions 253E, in which metal silicide regions 254 may also be provided. Furthermore, the gate electrode structures 260A, 260B, 260C may have formed therein metal silicide regions 267, such as nickel silicide, platinum silicide, a combination thereof and the like. Moreover, a further sidewall spacer structure 255 may be formed adjacent to the spacer structure 265 and may comprise one or more spacer elements, such as silicon nitride spacers, silicon oxide spacers and the like, in combination with one or more etch stop liners (not shown), depending on the overall device and process requirements. Furthermore, a dielectric material 220 may be formed above the active regions 202A, 202B and above the isolation structure 202C, thereby also enclosing the gate electrode structures 260A, 260B, 260C. In some illustrative embodiments, the dielectric layer 220 may comprise a highly-stressed dielectric material so as to enhance performance of one or both of the transistors 250A, 250B. For instance, a layer portion 220A may be formed above the structure 202C and the active region 202A with a high internal stress level, such as a compressive stress, in order to enhance performance of the transistor 250A together with the strain-inducing material 251. On the other hand, a layer portion 220B may be formed above the gate electrode structure 260B and the active region 202B with an internal stress level so as to enhance performance of the transistor 250B, for instance by inducing a tensile strain component in the channel region of the transistor 250B. Furthermore, a certain degree of material erosion, indicated as 205R may have occurred, thereby contributing to a certain degree of recessing in the isolation structure 202C, which, however, may be significantly less pronounced compared to a corresponding recessing obtained in accordance with conventional strategies, as previously explained with reference to FIG. 1f.

The semiconductor device 200 as illustrated in FIG. 2d may be formed in accordance with any appropriate process strategies, for instance as also described with reference to the semiconductor device 100. Thus, during the process sequence, the recessing 205R in the isolation structure 202C may be substantially caused by any cleaning processes and by a pre-cleaning process prior to forming the metal silicide regions 254 and 267 on the basis of a process technique, as is also previously described with reference to the semiconductor device 100. Consequently, after the silicidation process, the dielectric material 220 may be provided on the basis of a less-pronounced surface topography compared to conventional devices, thereby enabling an enhanced degree of flexibility in forming the dielectric material 220 and any further dielectric materials to be formed on the material 220. For example, the less pronounced surface topography may reduce the probability of creating deposition-related irregularities, such as voids, in particular in isolation regions comprising a plurality of closely-spaced gate electrode structures, such as the structure 260C. Consequently, during the further processing, for instance for forming contact openings in an interlayer dielectric material to be formed above the dielectric material 220, the probability of creating leakage paths upon filling the contact openings with a conductive material may be reduced. Moreover, the less pronounced surface topography may provide the possibility of depositing an increased layer thickness of a highly-stressed dielectric material above the transistors 250A, 250B, thereby contributing superior performance characteristics of these transistors.

As a result, the present disclosure provides manufacturing techniques, in which sophisticated gate electrode structures may be formed on the basis of a high-k dielectric material and work function adjusting species in an early manufacturing stage by confining the sensitive materials by an appropriate spacer structure. On the other hand, the integrity of the spacer structure may be preserved during the removal of a dielectric cap material by providing a sacrificial spacer structure, which may comprise at least one carbon-based spacer material. Since carbon may be efficiently patterned and removed substantially without affecting other materials, such as silicon dioxide, a corresponding material erosion, as may typically occur in conventional approaches, may be reduced, thereby providing superior process conditions during the further processing of the semiconductor device. Hence, reduced yield losses, for instance caused by contact failures, in combination with superior device performance, may be accomplished by using a carbon-based sacrificial spacer element.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a gate electrode structure of a transistor above a semiconductor region of a semiconductor device, said gate electrode structure comprising a gate insulation layer comprising a high-k gate dielectric material, a metal-containing cap material formed on said gate insulation layer, an electrode material formed above said metal-containing cap material, a dielectric cap layer formed above said electrode material and a sidewall spacer structure;
    forming a sacrificial carbon spacer on said sidewall spacer structure;
    removing said dielectric cap layer by using said sacrificial carbon spacer as an etch stop material for protecting said sidewall spacer structure; and
    removing said sacrificial carbon spacer.

2. The method of claim 1, wherein removing said dielectric cap layer comprises performing a plasma-assisted etch process.

3. The method of claim 1, wherein removing said sacrificial carbon spacer comprises performing an oxygen plasma etch process.

4. The method of claim 1, wherein said sidewall spacer structure and said dielectric cap layer comprise silicon nitride.

5. The method of claim 1, further comprising forming drain and source regions in said semiconductor region after removing said sacrificial carbon spacer.

6. The method of claim 5, further comprising forming a strain-inducing dielectric material above said drain and source regions and said gate electrode structure.

7. The method of claim 1, further comprising forming drain and source extension regions in the presence of said dielectric cap layer prior to forming said sacrificial carbon spacer.

8. The method of claim 1, further comprising forming drain and extension regions after removing said dielectric cap layer and after removing said sacrificial carbon spacer.

9. The method of claim 1, further comprising forming a strain-inducing semiconductor alloy in said semiconductor region in the presence of said gate electrode structure and using said dielectric cap layer and said sidewall spacer structure as a mask.

10. The method of claim 1, further comprising forming a semiconductor alloy on said semiconductor region prior to forming said gate electrode structure.

11. A method of forming a transistor of a semiconductor device, the method comprising:
    forming a strain-inducing semiconductor alloy in an active region in the presence of a gate electrode structure, said gate electrode structure comprising a high-k dielectric material, an electrode material, a dielectric cap layer and a sidewall spacer structure;
    forming a sacrificial spacer structure on said sidewall spacer structure;
    removing said dielectric cap layer selectively to said sacrificial spacer structure by performing a plasma-assisted etch process;
    removing at least a portion of said sacrificial spacer structure; and
    forming drain and source regions in said active region.

12. The method of claim 11, wherein forming said sacrificial spacer structure comprises depositing a carbon material and patterning said carbon material to form a spacer element.

13. The method of claim 12, wherein removing at least a portion of said sacrificial spacer structure comprises removing at least said carbon spacer element.

14. The method of claim 11, wherein forming said drain and source regions comprises forming drain and source extension regions prior to removing said dielectric cap layer.

15. The method of claim 11, further comprising forming a strain-inducing dielectric material above said drain and source regions and said gate electrode structure.

16. The method of claim 11, wherein removing said at least a portion of said sacrificial spacer structure comprises performing a plasma-assisted etch process using an oxygen plasma.

17. A method of forming a semiconductor device, the method comprising:
    forming a first gate electrode structure above a first active region and a second gate electrode structure above a second active region;
    forming a first spacer structure selectively on sidewalls of said first gate electrode structure from a spacer layer, a remaining portion of said spacer layer covering said second gate electrode structure and said second active region;
    forming a strain-inducing semiconductor material in said first active region by using said first spacer structure, said remaining portion of the spacer layer and a dielectric cap layer of said first and second gate electrode structures as a mask;
    forming a second spacer structure on sidewalls of said second gate electrode structure from said remaining portion of said spacer layer;
    forming a protective spacer structure on said first and second spacer structures, said protective spacer structure comprising a carbon spacer element;
    removing said dielectric cap layer from said first and second gate electrode structures by using said protective spacer structure as an etch mask; and
    forming drain and source regions in said first and second active regions.

18. The method of claim 17, wherein said dielectric cap layer is removed by performing a plasma-assisted etch process.

19. The method of claim 17, further comprising removing at least said carbon spacer element.

20. The method of claim 17, wherein forming said first and second gate electrode structures comprises incorporating a high-k dielectric material into a gate dielectric material.

* * * * *